April 28, 1959 G. B. HOUCK, JR 2,884,545

TRANSISTOR PROTECTION CIRCUIT

Filed March 17, 1954

INVENTOR.
GLADDEN B. HOUCK, JR.

BY

ATTORNEY

United States Patent Office 2,884,545

Patented Apr. 28, 1959

2,884,545

TRANSISTOR PROTECTION CIRCUIT

Gladden B. Houck, Jr., Port Chester, N.Y., assignor to General Precision Laboratory Incorporated, a corporation of New York Application March 17, 1954, Serial No. 416,917

1 Claim. (Cl. 307—88.5)

This invention relates to transistor circuits and particularly to transistor circuits which protect the transistors from damage by excessive current.

Point contact and junction transistors may be damaged by excessive current in two principal ways. When potential applied to the collector has the usual polarity, positive for n-p-n transistors and negative for p-n-p transistors, and when the forward emitter current is sufficiently increased, the collector current will increase beyond its design limit and irreversible changes will be caused in the transistor. This type of injury is easily guarded against in the design of the circuit by including conventional current-limiting resistor networks.

The other type of injury is probable when the transistor is employed in circuits permitting alternating potential to be introduced into the collector circuit superimposed on the direct bias current. Such circuits are typified by magnetic amplifier drivers, phase detectors, and circuits containing saturable core reactors. In such circuits feedback of the controlled alternating voltage will occur in variable amounts. When the feedback alternating voltage peak magnitude equals the bias voltage the collector voltage will be doubled once each cycle and brought to zero once each cycle, and when the feedback peak exceeds the bias voltage the collector voltage will be reversed once each cycle. This is liable to result in instant destruction of the transistor, because of the low forward resistance of the junction.

It is this type of current damage which the instant invention prevents. Damage is prevented by adding unilateral conductivity devices to the circuit in either or both of two ways. In one construction, the unilateral conductivity device is connected in series with the transistor with such polarity as to prevent forward current flow through the transistor. In another construction the unilateral conductivity device is connected in shunt with the transistor with such polarity as to have high resistance when the collector voltage is normal but having low shunting resistance when the collector voltage is reversed.

One purpose of this invention is to provide transistor circuits which protect against reversed collector voltages.

Another purpose of this invention is to provide transistor circuit protection against reversed collector voltages due to alternating currents introduced from the connected load.

A further understanding of this invention may be secured from the detailed description and drawings, in which.

Figure 1:
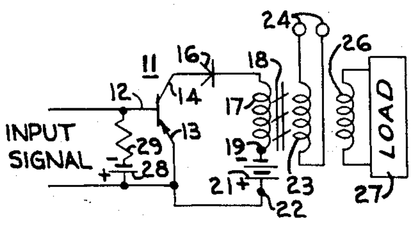
Figure 1 depicts a transistor amplifier protected by a series diode and driving a saturable core transformer.

Referring now to Fig. 1, a p-n-p junction transistor 11 is connected as a common emitter amplifier with the input signal applied between the base 12 and the emitter 13. The collector 14 is connected through a unilateral conductivity device 16 in series with the direct-current control winding 17 of a saturable core transformer 18 to the negative terminal 19 of a bias battery 21. The positive terminal 22 is returned to the emitter 13. The primary winding 23 of the transformer 18 is connected to an alternating current energization circuit represented by the terminals 24. This energization circuit provides power at whatever voltage and frequency are required by the utilization circuit, for example, 115 volts and 60 cycles per second. The secondary winding 26 is connected to a load circuit 27. Input circuit bias is applied to the base 12 from a battery 28 through resistor 29.

The unilateral conductivity device 16 may be of any character such as a barrier layer rectifying element, an electronic discharge tube diode, or a crystal rectifier.

In the operation of this circuit the battery 21 has a typical potential of 25 volts, and the junction transistor 11 typically has a maximum permitted collector current of 10 ma. in the normal or so-called inverse operating direction due to the battery potential. This maximum current limit can be safeguarded by proper design of the input circuit, but current flow in the opposite or so-called forward direction cannot be so prevented in the absence of the diode 16. When potential is applied between the collector 14 and emitter 13, with the positive potential terminal connected to the collector, so that the current flows in a direction from the collector through the base to the emitter, the transistor collector junction resistance becomes very low. If at the same time the resistance of the control coil 17 below, the forward transistor current will be high in the absence of diode 16, and will double for every increase of 0.02 volt of collector potential. It therefore requires but little voltage in the forward direction to damage the transistor. However, the diode 16 prevents any appreciable current flow in this direction while offering negligible resistance to current flow in the direction from the collector to the negative battery terminal 19.

Figure 2:
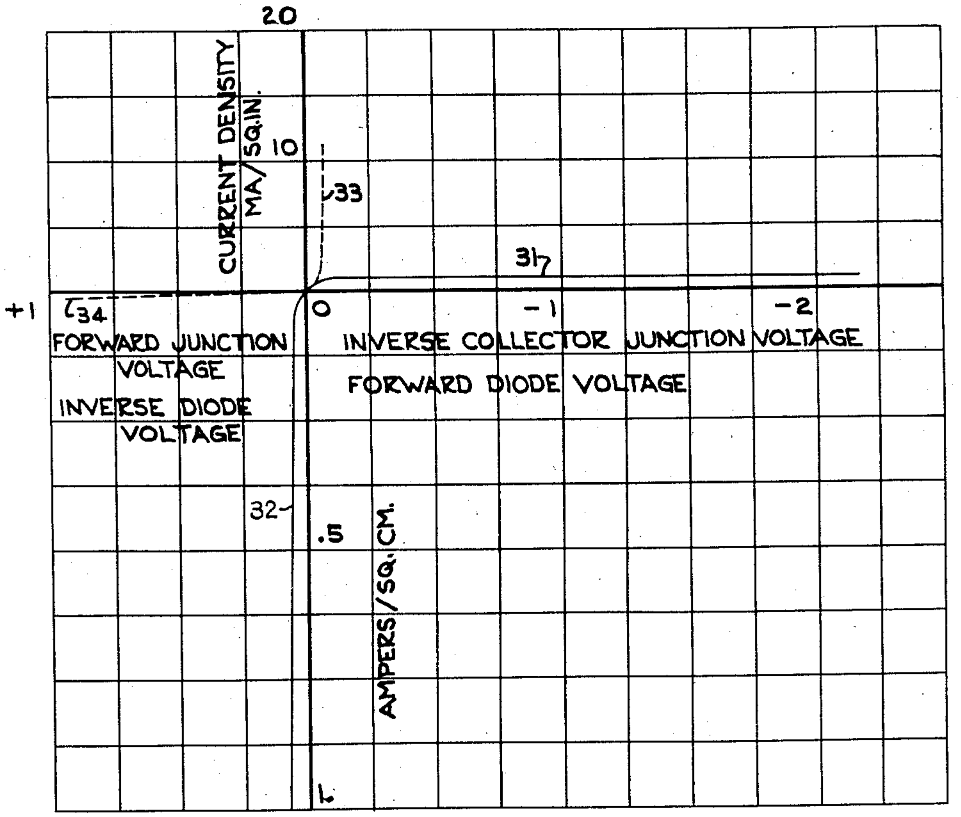
Figure 2 illustrates transistor and diode characteristic curves.

Fig. 2 depicts a characteristic curve for the transistor 11 at a selected emitter potential, the branch 31 constituting the normal operating range in which the current through the collector junction is in the inverse direction. The branch 32 illustrates the characteristic operation in the forward direction, showing runaway current when the potential applied to the collector opposes and exceeds that of the battery 21. Fig. 2 also depicts in dashed lines the characteristic of the diode 16; when current flows in the inverse or normal direction in the transistor and hence in the diode forward direction, operation occurs on that portion indicated by the branch 33 and low resistance is introduced into the circuit. When, however, the potential of battery 21 is overcome by alternating current induced in control winding 17 a very high resistance is presented by the diode 16 as indicated by the characteristic of the branch 34.

Figure 3:
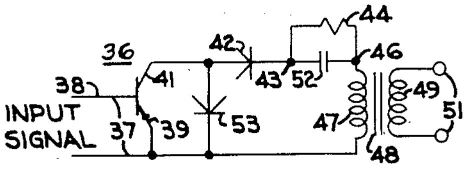
Figure 3 depicts a transistor amplifier protected by both a series diode and a shunt diode in a phase detector circuit.

Fig. 3 depicts a phase detector employing a transistor, and illustrates the use of a shunt diode in combination with the series diode just described to protect the transistor. The series and shunt diodes, in addition to their protective functions, also act in combination with the transistor to form the necessary elements of a phase detector.

In Fig. 3 a p-n-p transistor 36 is connected in a common emitter amplifying circuit, the input conductors 37 being connected to base 38 and emitter 39. The collector 41 is connected through a protective and functional diode 42 to one terminal 43 of a load resistance 44 shunted by a condenser 52. The other terminal 46 of the load resistance 44 is connected through the secondary winding 47 of a phasing transformer 48 to the emitter 39. The primary winding 49 of the transformer 48 is connected to a source of phasing potential represented by the terminals 51.

In the operation of this circuit an alternating potential of the same frequency as that at terminals 51 is applied as an input signal to conductors 37. At the same time transformer 48 applies an alternating potential of suitable magnitude between terminal 46 and the emitter 39. If now the potentials applied to the condenser terminals 43 and 46 are in phase these potentials vary in concert, and the condenser 52 is not charged. If, however, the potentials vary in opposite phase the condenser 52 will be charged twice, in opposite directions, disregarding diode 42. The diode 42, however, permits only positive potentials to be present on the terminal 43, so that the condenser is charged in one direction only and is maintained at a magnitude representative of the relative phase of the input signal. This condenser charge is utilized as direct current in the load 44, which may be an ammeter or voltmeter type of phase indicator, to indicate the magnitude of phase difference.

The diode 42 performs the necessary functions of rectifying the charges applied to terminal 43 and preventing forward current through the collector junction of transistor 36. If such current should occur while the input signal renders the base 38 negative relative to the emitter 39, the transistor would be burned out instantly. The diode 53 further protects the transistor 36 by acting as a low resistance shunt across it for current originating in the secondary winding 47 when its terminal 46 is positive. Thus whatever current is permitted by diode 42 to pass is largely shunted around the transistor by diode 53, which under this condition has a resistance less than that of the transistor.

What is claimed is:

A transistor phase detector comprising, a transistor having collector, base and emitter electrodes, means for impressing an input signal between said base and emitter electrodes, a source of phasing potential, a load and a unidirectional conductive device connected in series between said collector and emitter electrodes, said unidirectional conductive device being poled to have greater conductivity in the direction of inverse collector current flow, and a second unidirectional conductive device connected in shunt with said transistor directly between said collector and emitter electrodes, said second unidirectional conductive device being poled in a direction to provide a low resistance path for phasing potentials tending to produce a forward collector current flow.

References Cited in the file of this patent

UNITED STATES PATENTS

| | | |
|---|---|---|
| 2,476,323 | Rack | July 19, 1949 |
| 2,622,211 | Trent | Dec. 16, 1952 |
| 2,629,833 | Trent | Feb. 24, 1953 |
| 2,655,609 | Shockley | Oct. 13, 1953 |
| 2,665,845 | Trent | Jan. 12, 1954 |
| 2,691,073 | Lowman | Oct. 5, 1954 |
| 2,705,287 | Lo | Mar. 29, 1955 |
| 2,722,649 | Immel et al. | Nov. 1, 1955 |
| 2,724,061 | Emery | Nov. 15, 1955 |
| 2,747,111 | Koch | May 22, 1956 |
| 2,759,179 | Kircher | Aug. 14, 1956 |